(12) United States Patent
Xu et al.

(10) Patent No.: US 10,601,221 B2
(45) Date of Patent: Mar. 24, 2020

(54) ELECTROSTATIC PROTECTION CIRCUIT OF DISPLAY PANEL AND DISPLAY PANEL

(71) Applicant: Wuhan China Star Optoelectronics Technology Co., Ltd., Wuhan, Hubei (CN)

(72) Inventors: Pinquan Xu, Hubei (CN); Yuanfu Liu, Hubei (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 254 days.

(21) Appl. No.: 15/579,469

(22) PCT Filed: Nov. 30, 2017

(86) PCT No.: PCT/CN2017/114004
§ 371 (c)(1),
(2) Date: Dec. 4, 2017

(87) PCT Pub. No.: WO2019/041605
PCT Pub. Date: Mar. 7, 2019

(65) Prior Publication Data
US 2019/0229530 A1    Jul. 25, 2019

(30) Foreign Application Priority Data

Sep. 1, 2017 (CN) .......................... 2017 1 0780276

(51) Int. Cl.
*H02H 9/04* (2006.01)
*H01L 27/02* (2006.01)
(Continued)

(52) U.S. Cl.
CPC ....... *H02H 9/046* (2013.01); *G02F 1/136204* (2013.01); *H01L 27/0266* (2013.01);
(Continued)

(58) Field of Classification Search
CPC . H02H 9/046; H01L 27/0266; H01L 27/0296; G09G 3/36; G09G 3/3225; G09G 2330/04; G02F 1/136204
(Continued)

(56) References Cited

U.S. PATENT DOCUMENTS 7,420,251 B2 *   9/2008   Chen ................... H01L 27/0285
                                                              257/355

FOREIGN PATENT DOCUMENTS

CN      101369587 A       2/2009
CN      102651547 A       8/2012

* cited by examiner

*Primary Examiner* — Dharti H Patel
(74) *Attorney, Agent, or Firm* — Hemisphere Law, PLLC; Zhigang Ma

(57) ABSTRACT

An electrostatic protection circuit of a display panel includes a first P-type thin film transistor having a gate connected to a high potential electrostatic output line and a drain connected to a high potential electrostatic output line, a second P-type thin film transistor having a gate connected to a high potential electrostatic output line and a drain connected to a source of the first P-type thin film transistor, and a source connected to the electrostatic signal input line; a first N-type thin film transistor having a gate connected to the low potential electrostatic output line, and a drain connected to the low potential electrostatic output line; a second N-type thin film transistor having a gate connected to the low potential electrostatic output line and a drain connected to the source of the first N-type thin film transistor, and a source connected to the electrostatic signal input line.

6 Claims, 2 Drawing Sheets

(51) Int. Cl.
*G02F 1/1362* (2006.01)
*G09G 3/3225* (2016.01)
*G09G 3/36* (2006.01)

(52) U.S. Cl.
CPC ....... *H01L 27/0296* (2013.01); *G09G 3/3225* (2013.01); *G09G 3/36* (2013.01); *G09G 2330/04* (2013.01)

(58) Field of Classification Search
USPC .......................................................... 361/56
See application file for complete search history.

ELECTROSTATIC PROTECTION CIRCUIT OF DISPLAY PANEL AND DISPLAY PANEL

RELATED APPLICATIONS

The present application is a National Phase of International Application Number PCT/CN2017/114004, filed Nov. 30, 2017, and claims the priority of China Application No. 201710780276.X, filed Sep. 1, 2017.

FIELD OF THE DISCLOSURE

The disclosure relates to a display technical field, and more particularly to an electrostatic protection circuit of a display panel and a display panel.

BACKGROUND

At present, the electrostatic discharge, ESD phenomenon of the circuit in the liquid crystal display panel is serious, circuit damage by ESD has been very common.

In the integrated chip, IC bonding area of the liquid crystal display panel, an external digital signal needs to be input to an input pin, and then input to an output pin through the integrated chip, to enter the display area of the liquid crystal display panel. During this process, the electrostatic jumps irregularly from the input pin to the output pin, thus easily injuring the output pin, resulting in the yield dropping.

SUMMARY

In order to solve the problems in the conventional technology, an object of the present application is to provide an electrostatic protection circuit of a display panel and a display panel capable of transferring electrostatic from the output pin.

According to an aspect of the present application, an electrostatic protection circuit of a display panel is provided, the electrostatic protection circuit including: a high potential electrostatic output line, a low potential electrostatic output line, a first P-type thin film transistor, a second P-type thin film transistor, a first N-type thin film transistor, a second N-type thin film transistor, and an electrostatic signal input line; a gate of the first P-type thin film transistor connected to the high potential electrostatic output line, and a drain of the first P-type thin film transistor connected to the high potential electrostatic output line; a gate of the second P-type thin film transistor connected to the high potential electrostatic output line, a drain of the second P-type thin film transistor connected to a source of the first P-type thin film transistor, and a source of the second P-type thin film transistor connected to the electrostatic signal input line; a gate of the first N-type thin film transistor connected to the low potential electrostatic output line, a drain of the first N-type thin film transistor connected to the low potential electrostatic output line; and a gate of the second N-type thin film transistor connected to the low potential electrostatic output line, a drain of the second N-type thin film transistor connected to a source of the first N-type thin film transistor, and a source of the second N-type thin film transistor connected to the electrostatic signal input line.

Further, when no electrostatic discharge is occurred in the display panel, the potential of the electrostatic signal input line is between the high potential electrostatic output line and the low potential electrostatic output line, all of the first P-type thin film transistor, the second P-type thin film transistor, the first N-type thin film transistor, and the second N-type thin film transistor are turned off.

Further, when the electrostatic discharge is occurred in the display panel, the potential of the electrostatic signal input line is higher than the potential of the high potential electrostatic output line, the first P-type thin film transistor and the second P-type thin film transistor are turned on, the first N-type thin film transistor and the second N-type thin film transistor are turned off.

Further, when the electrostatic discharge is occurred in the display panel, the potential of the electrostatic signal input line is lower than the potential of the low-potential electrostatic output line, the first P-type thin film transistor and the second P-type thin film transistor are turned off, the first N-type thin film transistor and the second N-type thin film transistor are turned on.

Further, the potential of the high potential electrostatic output line is the same as the potential of the gate-on voltage of the thin film transistor of a pixel in the display panel, and the potential of the low potential electrostatic output line is the same as the potential of the gate-off voltage of the thin film transistor of the pixel in the display panel.

According to an aspect of the present application, the present application further provides a display panel including the electrostatic protection circuit described above.

Further, the display panel is a liquid crystal display panel or an organic light emitting diode display panel.

The present application has the following beneficial effects: The application transfers the electrostatic on the output pin to the electrostatic protection circuit, so as to prevent the electrostatic from injuring the output pin, thus protecting the output pin, and further improving the antistatic ability of the display panel.

BRIEF DESCRIPTION OF THE DRAWINGS

The above and other aspects, features and advantages of the embodiments of the present invention will become more apparent from the following description taken in conjunction with the accompanying drawings, in the figures.

DETAILED DESCRIPTION OF PREFERRED EMBODIMENTS

Figure 1:
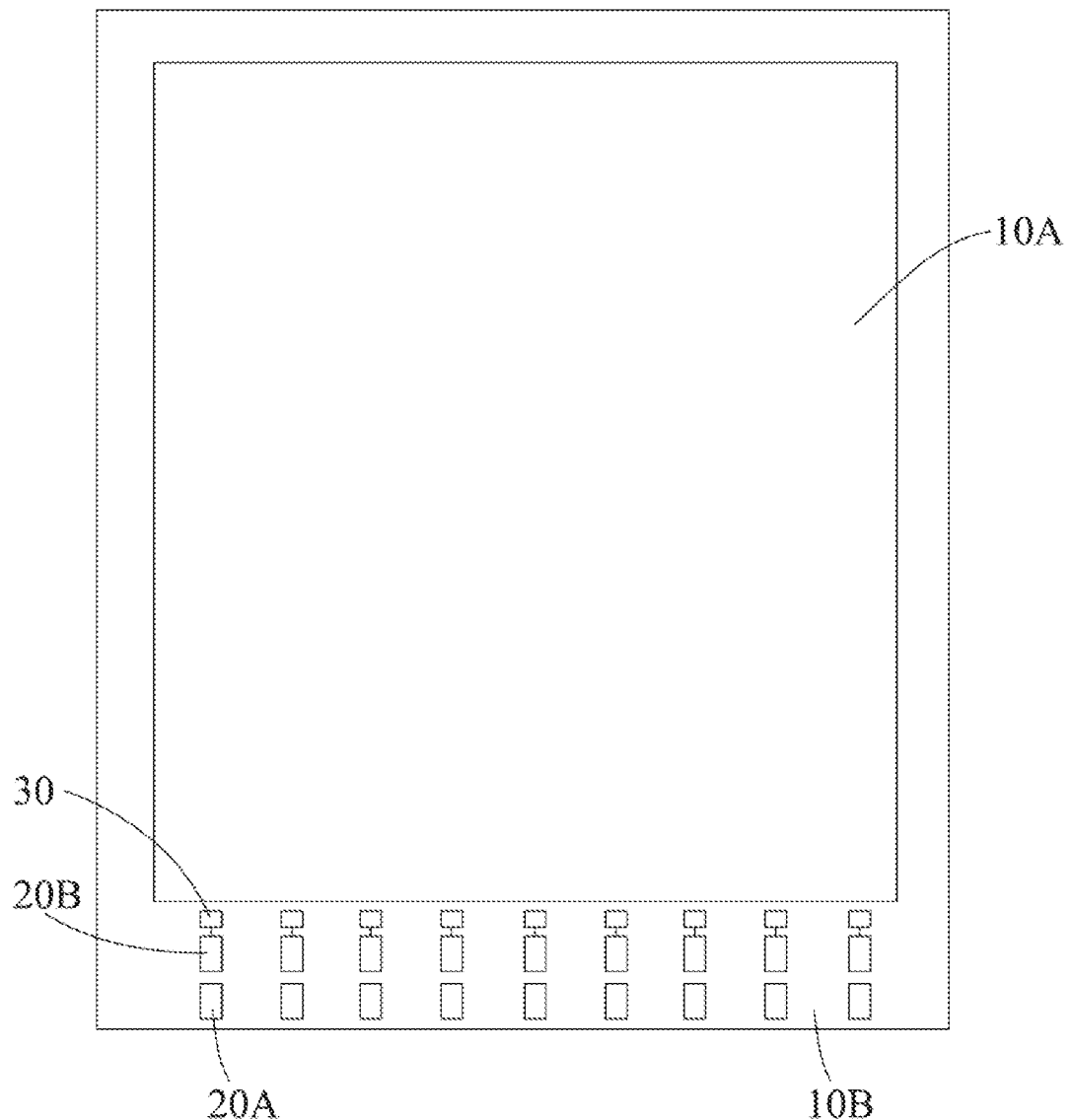
FIG. 1 is a schematic structural view of a display panel according to an embodiment of the present application.

Hereinafter, embodiments of the present invention will be described in detail with reference to the accompanying drawings. However, the invention may be embodied in many different forms and should not be construed as limited to the specific embodiments set forth herein. Rather, these embodiments are provided to explain the principles of the invention and its practical application to thereby enable those of ordinary skill in the art to understand various embodiments of the invention and various modifications as are suited to the particular use contemplated.

In the drawings, the thickness of layers and regions is exaggerated for clarity. The same reference numbers are used throughout the specification and the drawings to refer to the same or similar elements.

FIG. 1 is a schematic structural view of a display panel according to an embodiment of the present application.

Referring to FIG. 1, the display panel according to an embodiment of the present application includes: a display area 10A and a bonding area 10B disposed at a side of the display area 10A. The display area 10A generally includes a plurality of pixels (not shown) arranged in an array type, each pixel includes at least one thin film transistor (not shown). The bonding area 10B includes an input pin 20A and an output pin 20B opposite to the input pin 20A. The input pin 20A is received with an external digital signal; the external digital signal is inputted through an integrated chip to the output pin, to enter. The display area 10A of the display panel, to be provided to each pixel. In addition, in this embodiment, the display panel may be, for example, a liquid crystal display panel or an organic light emitting diode display panel, but the present application is not limited thereto.

Further, an electrostatic protection circuit 30 is further disposed in the bonding area 10B. Each of the output pins 20B may be connected to a corresponding one of the electrostatic protection circuits 30, or all of the output pins 20B are connected to the same one of the electrostatic protection circuits 30, so that when the output pin 20B is subjected to electrostatic discharge, the electrostatic can be transferred by the connected protection circuit 30, so as to protect the output pin 20B. In the present embodiment, each output pins 20B is connected to one electrostatic protection circuit, but the present application is not limited thereto.

The electrostatic protection circuit 30 according to the embodiment of the present application will be described below in detail. Three output pins 20B and three electrostatic protection circuits 30 will be described as an example.

Figure 2:
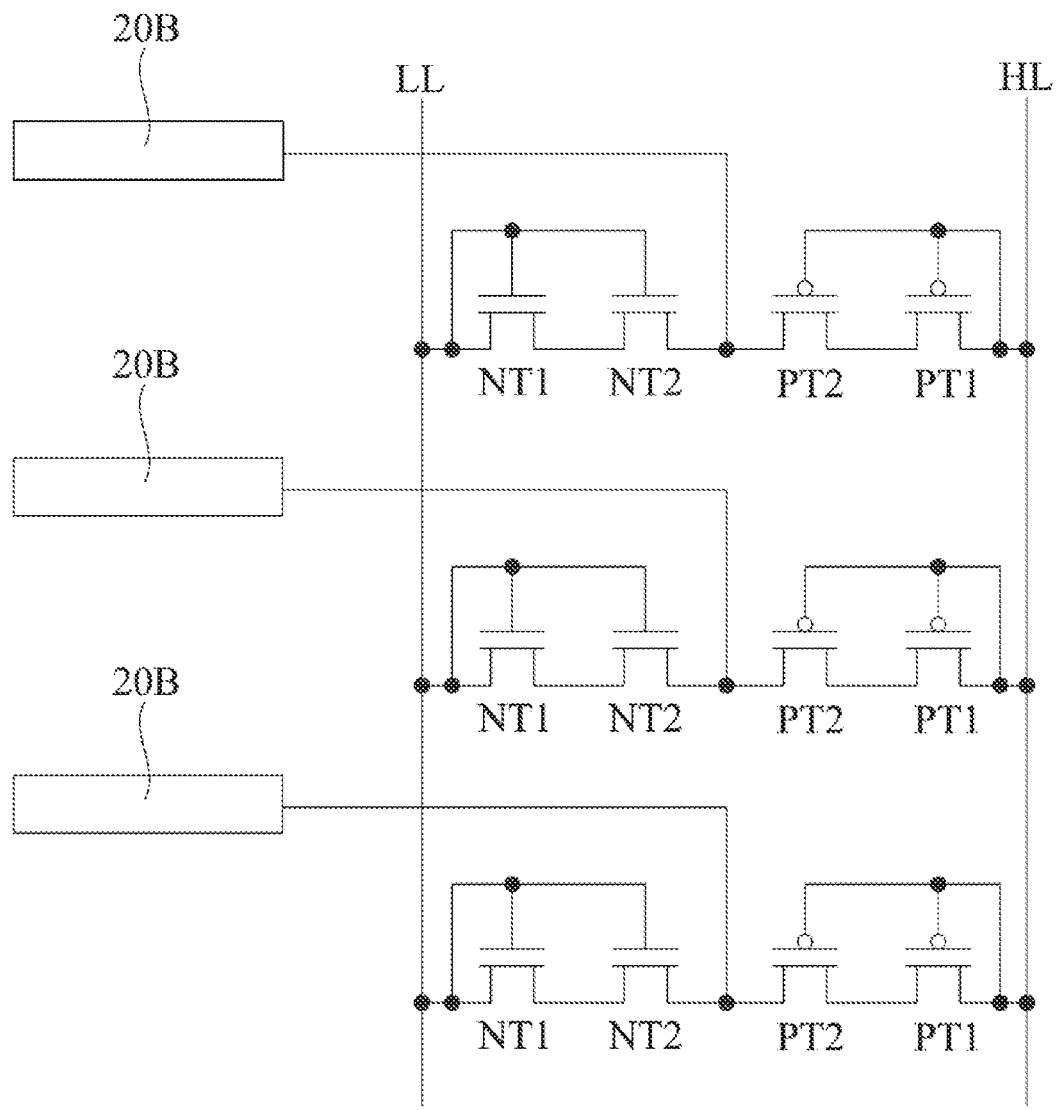
FIG. 2 is a circuit configuration diagram of an electrostatic protection circuit according to an embodiment of the present application.

FIG. 2 is a circuit configuration diagram of an electrostatic protection circuit according to an embodiment of the present application.

Referring to FIG. 2, the electrostatic protection circuit 30 according to an embodiment of the present application includes: a high potential electrostatic output line HL, a low potential electrostatic output line LL, a first P-type thin film transistor PT1, a second P-type thin film transistor PT2, a first N-type thin film transistor NT1, a second N-type thin film transistor NT2, and an electrostatic signal input line IL.

The potential of the high potential electrostatic output line HL is higher than the potential of the low potential electrostatic output line LL. As one embodiment of the present application, the potential of the high potential electrostatic output line HL is the same as the potential of the gate-on voltage (VGH) of the thin film transistor of the pixel in the display area 10A, and the potential of the low potential electrostatic output line LL is the same as the potential of the gate-off voltage (VGL) of the thin film transistor of the pixel in the display area 10A.

A gate of the first P-type thin film transistor PT1 is connected to the high potential electrostatic output line HL, and a drain of the first P-type thin film transistor PT1 is connected to the high potential electrostatic output line HL, and a source of the first P-type thin film transistor PT1 is connected to a drain of the second P-type thin film transistor PT2.

A gate of the second P-type thin film transistor PT2 is connected to the high potential electrostatic output line HL, and the drain of the second P-type thin film transistor PT2 is connected to the source of the first P-type thin film transistor PT1, and a source of the second P-type thin film transistor PT2 is connected to the electrostatic signal input line IL.

A gate of the first N-type thin film transistor NT1 is connected to the low potential electrostatic output line LL, a drain of the first N-type thin film transistor NT1 is connected to the low potential electrostatic output line LL, and a source of the first N-type thin film transistor NT1 is connected to a drain of the second N-type thin film transistor NT2.

A gate of the second N-type thin film transistor NT2 is connected to the low potential electrostatic output line LL, and the drain of the second N-type thin film transistor NT2 is connected to the source of the first N-type thin film transistor NT1, and a source of the second N-type thin film transistor NT2 is connected to the electrostatic signal input line IL.

The specific principle of the electrostatic protection circuit 30 according to the embodiment of the present application is as follows:

When no electrostatic discharge is occurred in the display panel, the potential of the electrostatic signal input line IL is between the high potential electrostatic output line HL and the low potential electrostatic output line LL. At this time, all of the first P-type thin film transistor PT1, the second P-type thin film transistor PT2, the first N-type thin film transistor NT1, and the second N-type thin film transistor NT2 are turned off.

When the electrostatic discharge is occurred in the display panel, and the potential of the electrostatic signal input line IL is higher than the potential of the high potential electrostatic output line HL, the first P-type thin film transistor PT1 and the second P-type thin film transistor PT2 are turned on, the first N-type thin film transistor NT1 and the second N-type thin film transistor NT2 are turned off, the electrostatic is transferred from the output pin 20B to the high potential electrostatic output line HL, so as to protect the output pin 20B.

When the electrostatic discharge is occurred in the display panel, and the potential of the electrostatic signal input line IL is lower than the potential of the low-potential electrostatic output line LL, the first P-type thin film transistor PT1 and the second P-type thin film transistor PT2 are turned off, the first N-type thin film transistor NT1 and the second N-type thin film transistor NT2 are turned on, the electrostatic is transferred from the output pin 20B to the low-potential electrostatic output line LL, so as to protect the output pin 20B.

In summary, according to the embodiment of the application, the electrostatic on the output pin is transferred to the ESD protection circuit, so that the ESD pin can be prevented from being damaged, and the output pin can be protected, thereby improving the antistatic ability of the display panel.

The foregoing contents are detailed description of the disclosure in conjunction with specific preferred embodiments and concrete embodiments of the disclosure are not limited to these descriptions. For the person skilled in the art of the disclosure, without departing from the concept of the disclosure, simple deductions or substitutions can be made and should be included in the protection scope of the application.

What is claimed is:

1. An electrostatic protection circuit of a display panel, comprising:
   a high potential electrostatic output line, a low potential electrostatic output line, a first P-type thin film transistor, a second P-type thin film transistor, a first N-type thin film transistor, a second N-type thin film transistor, and an electrostatic signal input line;
   a gate of the first P-type thin film transistor connected to the high potential electrostatic output line, and a drain of the first P-type thin film transistor connected to the high potential electrostatic output line;

a gate of the second P-type thin film transistor connected to the high potential electrostatic output line, a drain of the second P-type thin film transistor connected to a source of the first P-type thin film transistor, and a source of the second P-type thin film transistor connected to the electrostatic signal input line;

a gate of the first N-type thin film transistor connected to the low potential electrostatic output line, a drain of the first N-type thin film transistor connected to the low potential electrostatic output line; and a gate of the second N-type thin film transistor connected to the low potential electrostatic output line, a drain of the second N-type thin film transistor connected to a source of the first N-type thin film transistor, and a source of the second N-type thin film transistor connected to the electrostatic signal input line, wherein when the electrostatic discharge is occurred in the display panel, the potential of the electrostatic signal input line is higher than the potential of the high potential electrostatic output line, the first P-type thin film transistor and the second P-type thin film transistor are turned on, the first N-type thin film transistor and the second N-type thin film transistor are turned off.

2. The electrostatic protection circuit according to claim 1, wherein the potential of the high potential electrostatic output line is the same as the potential of the gate-on voltage of the thin film transistor of a pixel in the display panel, and the potential of the low potential electrostatic output line is the same as the potential of the gate-off voltage of the thin film transistor of the pixel in the display panel.

3. A display panel comprising the electrostatic protection circuit according to claim 1.

4. The display panel according to claim 3, wherein the display panel is a liquid crystal display panel or an organic light emitting diode display panel.

5. An electrostatic protection circuit of a display panel, comprising:

a high potential electrostatic output line, a low potential electrostatic output line, a first P-type thin film transistor, a second P-type thin film transistor, a first N-type thin film transistor, a second N-type thin film transistor, and an electrostatic signal input line;

a gate of the first P-type thin film transistor connected to the high potential electrostatic output line, and a drain of the first P-type thin film transistor connected to the high potential electrostatic output line;

a gate of the second P-type thin film transistor connected to the high potential electrostatic output line, a drain of the second P-type thin film transistor connected to a source of the first P-type thin film transistor, and a source of the second P-type thin film transistor connected to the electrostatic signal input line;

a gate of the first N-type thin film transistor connected to the low potential electrostatic output line, a drain of the first N-type thin film transistor connected to the low potential electrostatic output line; and a gate of the second N-type thin film transistor connected to the low potential electrostatic output line, a drain of the second N-type thin film transistor connected to a source of the first N-type thin film transistor, and a source of the second N-type thin film transistor connected to the electrostatic signal input line, wherein when the electrostatic discharge is occurred in the display panel, the potential of the electrostatic signal input line is lower than the potential of the low-potential electrostatic output line, the first P-type thin film transistor and the second P-type thin film transistor are turned off, the first N-type thin film transistor and the second N-type thin film transistor are turned on.

6. The electrostatic protection circuit according to claim 5, wherein the potential of the high potential electrostatic output line is the same as the potential of the gate-on voltage of the thin film transistor of a pixel in the display panel, and the potential of the low potential electrostatic output line is the same as the potential of the gate-off voltage of the thin film transistor of the pixel in the display panel.

* * * * *